United States Patent
Liu et al.

(10) Patent No.: US 11,614,762 B2
(45) Date of Patent: Mar. 28, 2023

(54) VOLTAGE CONVERTER

(71) Applicant: SeeYA Optronics Co., Ltd., Shanghai (CN)

(72) Inventors: Ping-Lin Liu, Shanghai (CN); Chih-Pu Yeh, Shanghai (CN)

(73) Assignee: SeeYA Optronics Co., Ltd., Shanghai (CN)

( * ) Notice: Subject to any disclaimer, the term of this patent is extended or adjusted under 35 U.S.C. 154(b) by 104 days.

(21) Appl. No.: 17/389,833

(22) Filed: Jul. 30, 2021

(65) Prior Publication Data

US 2022/0206523 A1 Jun. 30, 2022

(30) Foreign Application Priority Data

Dec. 30, 2020 (CN) .......................... 202011613199.7

(51) Int. Cl.
*G05F 3/26* (2006.01)
*H03K 19/0185* (2006.01)
*H02M 1/08* (2006.01)

(52) U.S. Cl.
CPC .............. *G05F 3/262* (2013.01); *H02M 1/08* (2013.01); *H03K 19/018521* (2013.01); *G05F 3/26* (2013.01)

(58) Field of Classification Search
CPC ... G05F 3/24; G05F 3/242; G05F 3/26; G05F 3/262; G05F 3/205; G05F 1/46; H03K 19/018521; H03K 17/145; H03K 17/687; H03K 2217/0081; H02M 1/0029; H02M 1/08; H02M 1/088
See application file for complete search history.

(56) References Cited

U.S. PATENT DOCUMENTS

| | | | | |
|---|---|---|---|---|
| 9,312,747 | B1* | 4/2016 | Svorc | G05F 3/262 |
| 2003/0071677 | A1* | 4/2003 | Shimozono | G05F 3/242 |
| | | | | 327/538 |
| 2010/0052735 | A1* | 3/2010 | Burkland | H03K 19/018521 |
| | | | | 327/66 |
| 2018/0181157 | A1* | 6/2018 | Link | G05F 3/26 |
| 2019/0379372 | A1* | 12/2019 | Mou | H03F 1/301 |
| 2022/0035506 | A1* | 2/2022 | Zou | H03F 1/308 |

FOREIGN PATENT DOCUMENTS

| | | |
|---|---|---|
| CN | 111064457 A | 4/2020 |
| CN | 111367339 A | 7/2020 |

* cited by examiner

*Primary Examiner* — Thienvu V Tran
*Assistant Examiner* — Shahzeb K Ahmad
(74) *Attorney, Agent, or Firm* — Kolitch Romano Dascenzo Gates LLC

(57) ABSTRACT

A voltage converter comprises a current mirror circuit, a switch circuit, and a bias circuit electrically connected to a substrate of the switch circuit. When an electrical signal provided by the first electrical signal end is greater than an electrical signal provided by the second electrical signal end, the bias circuit is turned on to turn on the switch circuit, thereby an output end of the mirror current circuit outputs the electrical signal provided by the second electrical signal end. Otherwise, the output end of the current mirror circuit outputs the second voltage signal.

20 Claims, 11 Drawing Sheets

VOLTAGE CONVERTER

CROSS-REFERENCE TO RELATED APPLICATIONS

This application claims priority to Chinese Patent Application No. 202011613199.7, filed on Dec. 30, 2020, the entire contents of which are incorporated herein by reference.

TECHNICAL FIELD

The present disclosure relates to voltage regulator technology, and more particularly to the voltage converter that adjusts the voltage output via current adjustment.

BACKGROUND

A voltage converter, also known as a regulator, is a device that stabilizes the output voltage. The voltage converter can keep the output voltage stable through automatically adjusting in response to the changes of the input voltage or load.

The voltage converter typically includes a bias circuit to control bias voltage, which can ensure transistors and other devices in the voltage converter to work at a voltage below a withstand voltage. Bias voltage signals for multiple sets of voltage converters are provided from a bias circuit through bias voltage wiring.

However, when the bias voltage signals are provided through the bias voltage wiring, it is difficult to select and control magnitudes of the bias voltage signals, and the bias voltage signals can be easily interfered by noise. As a result, the performance of the voltage converter can be affected

SUMMARY

In the present disclosure, a voltage converter is provided to address the above described issues. The voltage convertor comprises a current mirror circuit, wherein a first end of the current mirror circuit is electrically connected to a first current end providing a first current signal, and a second end of the current mirror circuit is electrically connected to a second power end providing a second voltage signal; a switch circuit electrically connected between the first current end and a second electrical signal end, wherein a first end of the switch circuit is electrically connected to a first electrical signal end, and an output end of the switch circuit is electrically connected to an output end of the current mirror circuit; and a bias circuit electrically connected to a substrate of the switch circuit, wherein, the bias circuit is electrically connected between a bias current end and a ground end, and the bias current end provides a bias current signal, to raise a substrate voltage of the switch circuit while the bias circuit is turned on. When an electrical signal provided by the first electrical signal end is greater than an electrical signal provided by the second electrical signal end, the bias circuit is turned on, turning on the switch circuit, so that the first current signal is shunted by the switch circuit, which results in turning off of the current mirror circuit, thereby an output end of the mirror current circuit outputs the electrical signal provided by the second electrical signal end. When the electrical signal provided by the first electrical signal end is equal to the electrical signal provided by the second electrical signal end, the switch circuit is turned off, so that the first current signal is inputted into the current mirror circuit, turning on the current mirror circuit, thereby the output end of the current mirror circuit outputs the second voltage signal. The second voltage signal is greater than a high-level voltage signal provided by the first electrical signal end.

It should be readily understood that both the foregoing general description and the following detailed description are exemplary and explanatory only, and are not intended as a limitation to the scope of the present disclosure.

BRIEF DESCRIPTION OF THE DRAWINGS

The foregoing and other features, and advantages of the invention are apparent from the following detailed description taken in conjunction with the accompanying drawings in which:

FIG. 7 schematically illustrates a semiconductor structure diagram of a switch circuit and a bias circuit of a voltage converter according to an embodiment of the present disclosure, illustrating a state when the switch circuit is turned on;

DETAILED DESCRIPTION

In the following, embodiments of the present disclosure will be described in detail with reference to the figures. The concept of the present disclosure can be implemented in a plurality of forms, and should not be understood to be limited to the embodiments described hereafter. In contrary, these embodiments are provided to make the present disclosure more comprehensive and understandable, and so the conception of the embodiments can be conveyed to those skilled in the art fully. Same reference signs in the figures refer to same or similar elements, so repeated description of them will be omitted.

In addition, the technical features, assemblies, and characteristics can be combined in any appropriate way in one or more embodiments. In the following, more specific details are provided to give a full understanding to the embodiments of the present disclosure. However, those skilled in the art should realize that the technical proposal can also be realized without one or more of the specific details, or with other assemblies or components. In other conditions, some common assemblies or components well known in the art are not described to avoid making the present disclosure unclear.

To solve the problems in the prior art, a voltage converter of the present disclosure is configured to adjust the voltage output via a bias current. The voltage converter comprises a bias circuit to receive a bias current signal, and is driven by the bias current signal, so that a specific power-on timing for a bias circuit is not indispensable anymore, making the bias current signal easier to control and select. When the bias circuit is turned on, the bias current signal flows through a substrate of a switch circuit to raise a substrate voltage of the switch circuit, making the switch circuit reversely biased, thus the switch circuit turns on and shunts a first current signal to shut down a current mirror circuit, then an output end of the current mirror circuit outputs a low-level voltage signal; and when the switch circuit is shut down, the first current signal flows into the current mirror circuit to turn on the current mirror circuit, then the output end of the current mirror circuit outputs a high-level electrical signal. Compared with voltage, current is less sensitive to noise in a circuit. Thus, in the voltage convertor of the present disclosure, interferences in the working process of the voltage convert can be decreased by using stable bias current signals as bias signals, and the performance of the voltage converter can be improved.

Figure 1:
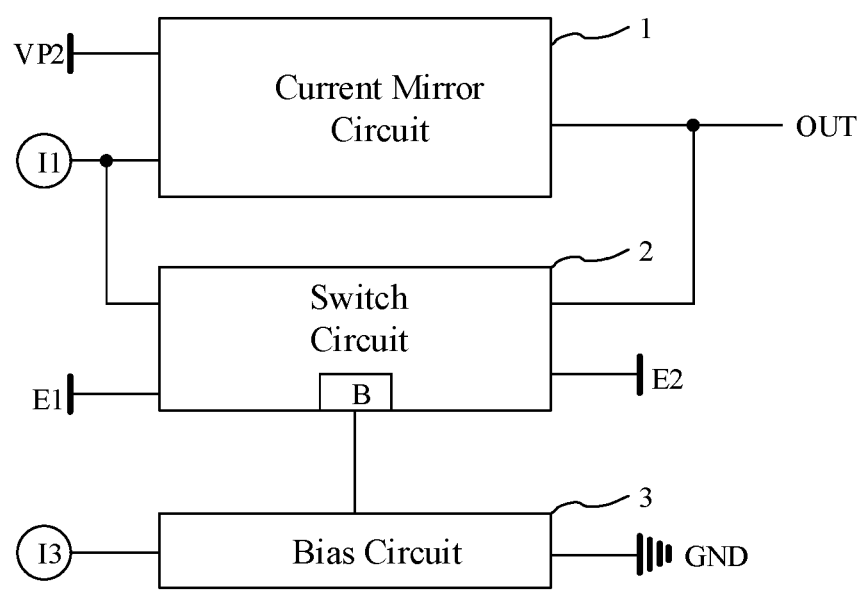
FIG. 1 is a schematic circuit diagram of a voltage converter according to an embodiment of the present disclosure.

FIG. 1 is a schematic circuit diagram of a voltage converter according to an embodiment of the present disclosure. As shown in FIG. 1, the voltage converter includes a current mirror circuit 1, a switch circuit 2 and a bias circuit 3. A first end of the current mirror circuit 1 is electrically connected to a first current end I1, and a second end of the current mirror 1 is electrically connected to a second power end VP2. The first current end I1 provides a first current signal, and the second power end VP2 provides a second voltage signal. The switch circuit 2 is electrically connected between the first current end I1 and a second electrical signal end E2, wherein a first end of the switch circuit 2 is electrically connected to a first electrical signal end E1, and an output end of the switch circuit 2 is electrically connected to an output end OUT of the current mirror circuit 1. The bias circuit 3 is electrically connected to a substrate B of the switch circuit 2, wherein the bias circuit 3 is electrically connected between a bias current end I3 and a ground end GND, and the bias current end I3 provides a bias current signal to raise a substrate B voltage of the switch circuit 2 while the bias circuit 3 is turned on. When an electrical signal provided by the first electrical signal end E1 is greater than an electrical signal provided by the second electrical signal end E2, the bias circuit 3 is turned on to turn on the switch circuit 2, so that the first current signal is shunted by the switch circuit 2, which results in turning off of the current mirror circuit 1, thereby an output end OUT of the mirror current circuit 1 outputs the electrical signal provided by the second electrical signal end E2. When the electrical signal provided by the first electrical signal end E1 is equal to the electrical signal provided by the second electrical signal end E2, the switch circuit 2 is turned off, so that the first current signal is inputted into the current mirror circuit 1 to turn on the current mirror circuit 1, thereby the output end OUT of the current mirror circuit 1 outputs the second voltage signal. The second voltage signal is greater than a high-level voltage signal provided by the first electrical signal end.

In this embodiment, the voltage converter includes the current mirror circuit 1, the current mirror circuit 1 is a mirror constant current source circuit, mainly composed of an input stage and an output stage. The input stage provides a reference current, and when the current mirror circuit 1 is turned on, the output stage outputs a required constant current signal. The controlled current into the current mirror circuit is equal to the input reference current. The output signal is a scaling of a certain proportion of the input reference current to generate a bias current or to serve as an active load. When the current mirror circuit 1 is turned on, a stable signal can be provided by the current mirror circuit 1 to ensure steady operation of other circuits. That is, the current mirror circuit 1 outputs a stable signal.

The first end of the current mirror circuit 1 is electrically connected to the first current end I1 to receive the first current signal provided by the first current end I1, and the first current signal is a stable current signal. The second end of the current mirror circuit 1 is electrically connected to the second power end VP2 to receive the second voltage signal provided by the second power end VP2, and the second voltage signal is a stable voltage signal. In some embodiments, the first end of the current mirror circuit 1 serves as a current driving end of the current mirror circuit 1. The magnitude of the current signal received by the current driving end controls the on and off states of the current mirror circuit 1. The second end of the current mirror circuit 1 serves as an input end of the current mirror circuit 1. When the current mirror circuit 1 is turned on, the output end of the current mirror circuit 1 outputs the second voltage signal provided by the second power end VP2.

In this embodiment, the voltage converter includes the switch circuit 2. In some embodiments, the switch circuit 2 comprises one or more MOS transistors. MOS transistors are metal-oxide/insulator-semiconductor field effect transistors, and are usually used in amplifying circuits or switching circuits due to their advantages of high input impedance, low noise, good thermal stability, simple manufacturing process, strong radiation, etc. It will be understood that the multiple MOS transistors can be made on one semiconductor or share a same semiconductor substrate. In other embodiments, the switch circuit can include other switching elements and made on the same semiconductor substrate.

The first end of the switch circuit 2 is electrically connected to the first electrical signal end E1, the switch circuit 2 is connected between the first current end I1 and the second electrical signal end E2, and the output end of the switch circuit 2 is electrically connected to an output end OUT of the current mirror circuit 1. The on and off states of the switch circuit 2 affects the signal of output end of the current mirror circuit 1. Optionally, the first end of switch circuit 2 serves as a control end of the switch circuit 2. The magnitude of the electrical signal provided by the first electrical signal end E1 controls the on and off states of the switch circuit 2. When the switch circuit 2 is turned on, an end of the switch circuit 2 connected to the second electrical signal end E2 serves as an input end of the switch circuit 2, and the output end of the switch circuit 2 outputs the electrical signal provided by the second electrical signal end E2.

In this embodiment, the voltage converter further includes the bias circuit 3. The bias circuit 3 is electrically connected to the substrate B of the switch circuit 2, and the bias circuit 3 is electrically connected between the bias current end I3 and the ground end GND. The bias current end I3 provides the bias current signal, which is a stable current signal. The bias circuit 3 is kept to be a state of constantly turning on, and the bias current signal flows into the ground through the bias circuit 3, that is, the bias current signal flows through the bias circuit 3. The bias circuit 3 is electrically connected to the substrate B of the switch circuit 2, and the bias current signal flows through the substrate B of the switch circuit 2 and then flows into the ground, which can raise the substrate voltage of the switch circuit 2, and thus decreases the turn-on threshold voltage of the switch circuit 2.

When the converter includes the bias circuit 3, the input end and the control end of the bias circuit 3 are inputted with a stable bias current signal, so the bias circuit 3 keeps turning on. Compared with current, voltage is more sensitive to noise, which will affect the performance of voltage converter. On the contrary, current is less sensitive to the noise in a circuit, which will reduce the noise interference to signals in the operation of the voltage converter, and thus improve the performance of the voltage converter.

The bias circuit 3 remains in the state of turning on. When the electrical signal (i.e., voltage signal) provided by the first electrical signal end E1 is greater than the electrical signal provided by the second electrical signal end E2, the substrate voltage of the switch circuit 2 can be raised as the bias current signal flows through the substrate B of the switch circuit 2, thereby reducing the turn-on threshold voltage of the switch circuit 2, and thus ensuring the turning on of the switch circuit 2, improving the stability of the voltage converter circuit. Furthermore, such configuration can avoid the problems of failure to turn on the switch circuit 2 when the signal output by the first electrical signal end E1 is too small. Optionally, the electrical signal provided by the second electrical signal end E2 is greater than 0V, smaller than 0V, or equal to 0V. The electrical signal provided by the first electrical signal end E1 is greater than the electrical signal provided by the second electrical signal end E2. For example, the electrical signal provided by the first electrical signal end E1 is greater than 0V.

The first current end I1 is electrically connected to the current mirror circuit 1 and the switch mirror circuit 2, respectively. When the switch circuit 2 is turned on, the current mirror circuit 1 and the switch circuit 2 shunt the constant first current signal provided by the first current end I1, then the current mirror circuit 1 cannot be turned on due to the decrease of its input current. The output end of the switch circuit 2 is electrically connected to the output end OUT of the current mirror circuit 1. If the current mirror circuit 1 is turned off, the signal of the output end OUT of the current mirror circuit 1 is determined by the output end of the switch circuit 2. The switch circuit 2 is also connected between the first current end I1 and the second electrical signal end E2, so the output end of switch circuit 2, which is also the output end OUT of current mirror circuit 1, outputs the electrical signal provided by the second electrical signal end E2.

When the electrical signal provided by the first electrical signal end E1 is equal to the electrical signal provided by the second electrical signal end E2, the switch circuit 2 is turned off. At such situation, whether the bias current signal flows through the substrate B of switch circuit 2 or not cannot affect the on and off states of the switch circuit 2. Optionally, the electrical signal provided by the second electrical signal end E2 is greater than 0V, equal to 0V, or smaller than 0V. The electrical signal provided by the first electrical signal end E1 is equal to the electrical signal provided by the second electrical signal end E2, for example, both may be equal to 0V.

The first current end I1 is electrically connected to the current mirror circuit 1 and the switch circuit 2, respectively. When the switch circuit 2 is turned off, the constant first current signal provided by the first current end I1 all flows into the current mirror circuit 1, then the current mirror circuit 1 is turned on. The second end of the current mirror circuit 1 is connected to the second power end VP2, and the second power end VP2 provides the second voltage signal. The signal from the output end OUT of the current mirror circuit 1 is determined by the second power end VP2, and the output end OUT of the current mirror circuit 1 outputs the second voltage signal provided by the second power end VP2.

The second voltage signal is greater than the high-level voltage signal provided by the first electrical signal end E1, and the electrical signal provided by the first electrical signal end E1 is greater than or equal to the electrical signal provided by the second electrical signal end E2. It will be understood that when the output end OUT of the current mirror circuit 1 outputs the second voltage signal provided by the second power supply end VP2, it outputs a high-level voltage signal. When the output end OUT of current mirror circuit 1 outputs the electric signal provided by the second electrical signal end E2, it outputs a low-level voltage signal. Thus, the voltage converter output the corresponding electrical signal according to different circuit conditions.

Optionally, the first electrical signal end E1 may provide a first square signal, and the second electrical signal end E2 is electrically connected to the ground end GND. In the first square signal, the electric potential of the high-level voltage signal is greater than or equal to the ground potential, and smaller than the electric potential of the second voltage signal. For example, the high-level voltage signal of the first square signal is greater than 0V, and the low-level voltage signal is 0V. In another example, the high-level voltage signal of the first square signal is equal to 0V.

In some embodiments, the first electrical signal end E1 provides the first voltage signal, and second electrical signal end E2 provides the first square signal; In the first square signal, the electric potential of the high-level voltage signal is equal to that of the first voltage signal and smaller than that of the second voltage signal. For example, the high-level voltage signal of the first square signal is greater than 0V, and the low-level voltage signal is 0V. In another example, the high-level voltage signal of the first square signal is equal to 0V.

In an embodiment of the present disclosure, the bias circuit is configured to receive the bias current signal, and is driven by the bias current signal, thus a specific power-on sequence is not required, and it is easier to control and select current. When the bias circuit is turned on, the bias current signal flows through the substrate of the switch circuit to raise the substrate voltage of the switch circuit, making the switch circuit reverse biased, thus the switch circuit can be turned on and shunts a first current signal to shut down the current mirror circuit, then the output end of the current mirror circuit outputs a low-level voltage signal consequently. When the switch circuit is turned off, the first current signal flows into the current mirror circuit directly to turn on the current mirror circuit, then the output end of the current mirror circuit outputs a high-level electrical signal. Compared with voltage, current is less sensitive to noise in a circuit. Thus, in the present disclosure, interferences due to the noises in the working process of the voltage converter can be reduced by using stable bias currents as bias signals, and the performance of the voltage converter can be improved.

Figure 2:
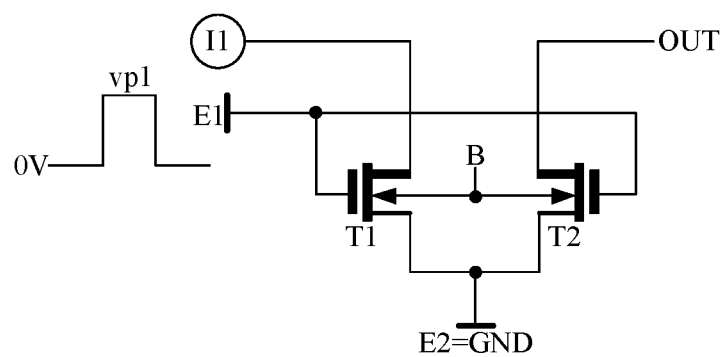
FIG. 2 is a schematic circuit diagram of a switch circuit of a voltage converter according to an embodiment of the present disclosure.
Figure 3:
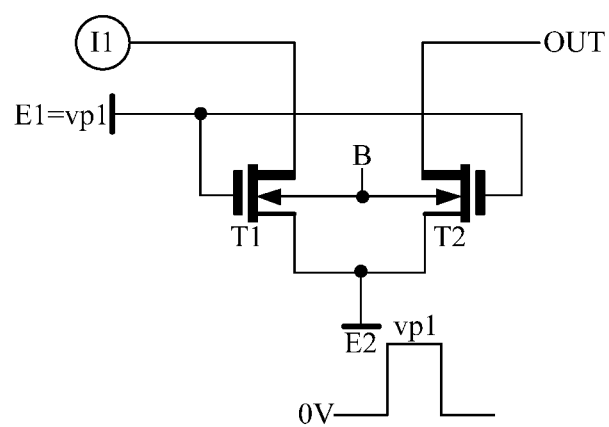
FIG. 3 is a schematic circuit diagram of another switch circuit of a voltage converter according to an embodiment of the present disclosure.

FIG. 2 and FIG. 3 show an embodiment of a switch circuit 2 of a voltage converter according to an embodiment of the present disclosure, illustrating the structures and operations of switch circuit 2. Switch circuit 2 comprises a first transistor T1 and a second transistor T2. In one embodiment, the second transistor T2 may be the same as the first transistor T1. A control end of the first transistor T1 and a control end of the second transistor T2 are both electrically connected to the first electrical signal end E1 The first transistor T1 is electrically connected between the first current end I1 and the second electrical signal end E2, and the second transistor T2 is electrically connected between the second electrical signal end E2 and the output end OUT of the current mirror circuit 1.

As shown in FIG. 2, the first electrical signal end E1 provides a first square wave signal (from 0V to vp1), and the second electrical signal end E2 is grounded at the ground end GND; the electric potential vp1 of the high-level voltage signal in the first square wave signal is greater than that of the ground end GND, and is smaller than the electric potential of the second voltage signal vp2.

When the electric potential provided by the first electrical signal end E1 is the high-level voltage signal of the first voltage signal vp1 and greater than 0V, the first transistor T1 is turned on, and the current signal output by the first current end I1 is shunted by the first transistor T1; and the second transistor T2 is turned on as well, the electrical potential of the output end OUT of the current mirror circuit is pulled down to 0V.

When the electric potential provided by the first electrical signal end E1 is equal to 0V, both the first transistor T1 and the second transistor T2 are turned off, and the output end OUT of the current mirror circuit outputs the second voltage signal.

As shown in FIG. 3, the first electrical signal end E1 provides a first voltage signal vp1, and the second electrical signal end E2 provides a first square signal (from 0V to vp1); the electric potential of the high-level voltage signal in the first square signal is equal to the first voltage signal vp1, and is smaller than the electric potential of the second voltage signal vp2.

When the electric potential provided by the first electrical signal end E1 is the high-level voltage signal of the first voltage signal vp1 which is greater than 0V, and the first square signal is 0V, the first transistor T1 is turned on. The current signal output by the first current end I1 is shunted by the first transistor T1, and the second transistor T2 is turned on, thus the output end OUT of the current mirror circuit is Pull down to 0V.

When the electric potential provided by the first electrical signal end E1 is the first voltage signal vp1 which is greater than 0V, and the first square signal is the high-level voltage signal of the first voltage signal vp1, both the first transistor T1 and the second transistor T2 are turned off, thus the output end OUT of the current mirror circuit outputs the second voltage signal vp2.

For the case that the electric potential of the first electrical signal end E1 is equal to 0, the voltage of the control end of the first transistor T1 and the control end of the second transistor T2 are both 0V, thus both the first transistor T1 and the second transistor T2 are turned off. At this time, the output end OUT of the current mirror circuit outputs the second voltage signal vp2. No matter whether the voltage of the control end of the first transistor T1 and the control end of the second transistor T2 are greater than 0V or equal to 0V, the switching state of the switch circuit is always known, and the output end of the current mirror circuit can output a valid signal, therefore, the situation where the output end of the current mirror circuit is unknown due to the unknown switching state of the switch circuit can be avoided.

Figure 4:
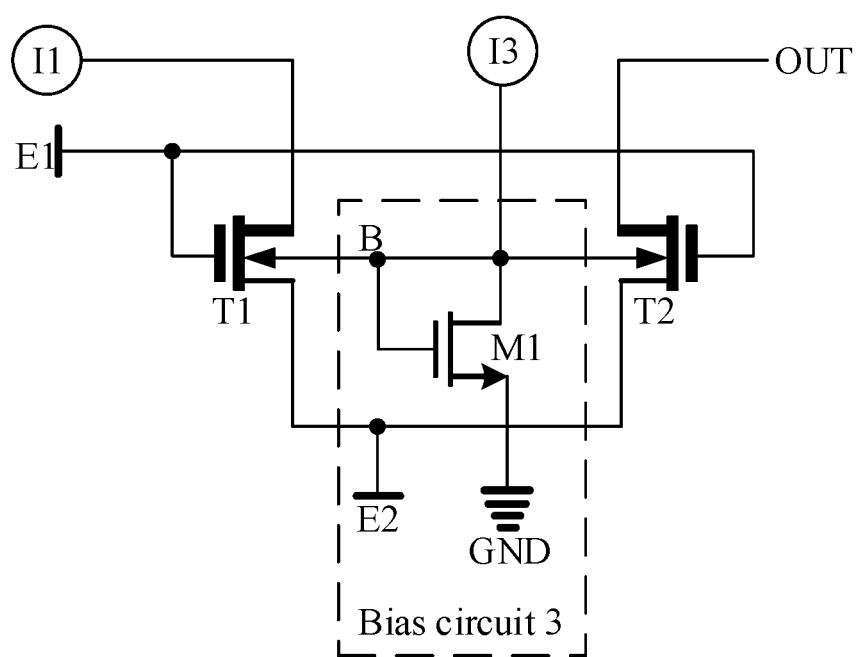
FIG. 4 schematically illustrates a switch circuit and a bias circuit of a voltage converter according to an embodiment of the present disclosure.

FIG. 4 illustrates the bias circuit 3 along with the switch circuit 2 of a voltage converter according to an embodiment of the present disclosure, illustrating the structures and operations of switch circuit 2. The components of the bias circuit 3 is shown schematically inside dash lines and the components of the switch circuit 2 is shown schematically outside dash lines. In some embodiments, the bias circuit 3 comprises a bias transistor M1, which is disposed on or shares a same semiconductor substrate B with the first transistor T1 and the second transistor T2 of the switch circuit 2. A control end of the bias transistor M1 is electrically connected to the semiconductor substrate B and the bias current end I3, respectively, an input end of the bias transistor M1 is electrically connected to the bias current end I3, and an output end of the bias transistor M1 is electrically connected to the ground end GND. In some embodiments, the bias transistor M1, the first transistor T1 and the second transistor T2 are all NMOS transistors. A voltage of the semiconductor substrate B is greater than 0V, and smaller than a threshold voltage of the first transistor T1. Optionally, the voltage of the semiconductor substrate B is equal to a turn-on voltage between the control end of the bias transistor M1 and an output end of the first transistor T1.

The bias current end I3 provides a stable bias voltage signal. In some embodiments, the bias transistor M1 is a NMOS transistor. The control end and the input end of the bias transistor M1 are electrically connected to the bias current end I3 respectively, and the output end of the bias transistor M1 is grounded. Thus, the bias transistor M1 can be kept to be turning on by the bias current signal. The control end of the bias transistor M1 is further electrically connected to the semiconductor substrate B of both the first transistor T1 and the second transistor T2, thus the bias current signal flows through the semiconductor substrate B, which can increase the electric potential of the semiconductor substrate B from 0V. Therefore, the voltage of the semiconductor substrate B is greater than 0V.

In some embodiments, the first transistor T1 and the second transistor T2 are both NMOS transistors. The increase of the substrate potential thereof will raise the electric potential of the output end (i.e., source electrode) of the first transistor T1 and the output end (i.e., source electrode) of the second transistor T2, thus both the threshold voltages of the first transistor T1 and the second transistor T2 are decreased, therefore the first transistor T1 and the second transistor T2 can be turned on through a lower voltage signal provided by the first electrical signal end E1.

Figure 5:
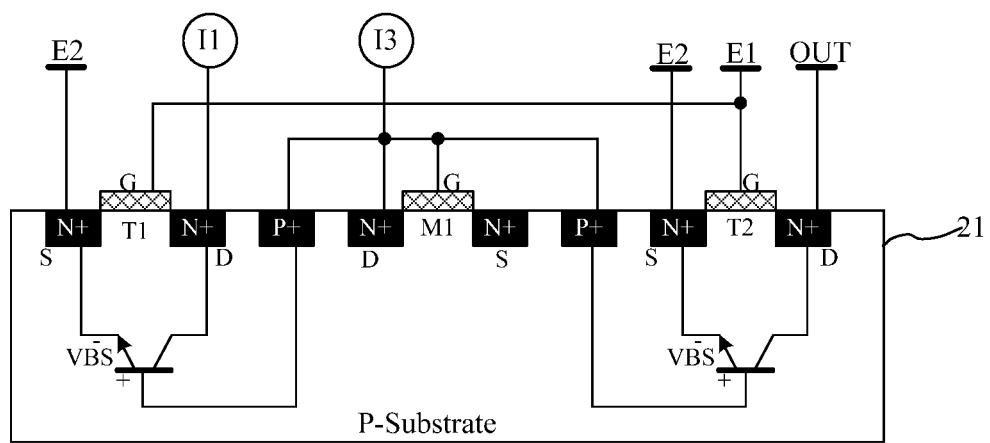
FIG. 5 schematically illustrates a semiconductor structure diagram of a switch circuit and a bias circuit of a voltage converter according to an embodiment of the present disclosure.

FIG. 5 is a schematical diagram of a semiconductor substrate 21 on which the components of the switch circuit 2 and the bias circuit 3 are disposed according to an embodiment of the present disclosure. The semiconductor substrate 21 is a lightly doped P− substrate. The semiconductor 21 is diffused with three groups of heavily doped N+ regions, two N+ regions in one group form the source regions and drain region of the transistor, and a channel is formed between the source and drain regions. A gate electrode G is provided above the channel, a source electrode S is provided in the source region, and a drain electrode D is provided in the drain region. Thus, the first transistor T1, the second transistor T2 and the bias transistor M1, which share the semiconductor substrate 21, are formed. The three transistors are all NMOS.

The gate electrode G and the drain electrode D of the bias transistor M1 are both electrically connected to the bias current end I3, and the source electrode S of the bias transistor M1 is grounded. The gate electrode G of the first transistor T1 is electrically connected to the first electrical signal end E1, the drain electrode D of the first transistor T1 is electrically connected to the first current end I1, and the source electrode S of the first transistor T1 is electrically connected to the second electrical signal end E2. The gate electrode G of the second transistor T2 is electrically connected to the first electrical signal end E1, the source electrode S of the second transistor T2 is electrically connected to the second electrical signal end E2, and the drain electrode D of the second transistor is electrically connected to the output end OUT of the current mirror circuit. The gate electrode G of the bias transistor M1 is electrically connected to the semiconductor substrate 21 as well. Specifically, two heavily doped P+ regions are formed on the semiconductor substrate 21, and the gate electrode G of the bias transistor M1 is connected to the two P+ regions, respectively. Therefore, the bias current signal is applied to the P+ region, which can raise the electric potential of the semiconductor substrate 21.

The gate electrode G and the drain electrode D of the bias transistor M1 are configured to receive the bias current signal, so that the bias current signal flows through the semiconductor substrate 21 to raise its electric potential. The voltage of the semiconductor substrate 21 can be interpreted as a voltage difference VBS between the gate electrode G of the bias transistor M1 and the source electrode S of the first transistor T1. There is a turn-on voltage $V_{TH\_B}$ between the gate electrode P+ of the bias transistor M1 and the source electrode N+ of the first transistor T1. The threshold voltage $V_{TH\_H}$ exists in the first transistor T1. The gate electrode G of the bias transistor M1 serves as its control end, and the source electrode S of the first transistor T1 serves as its output end.

Figure 6:
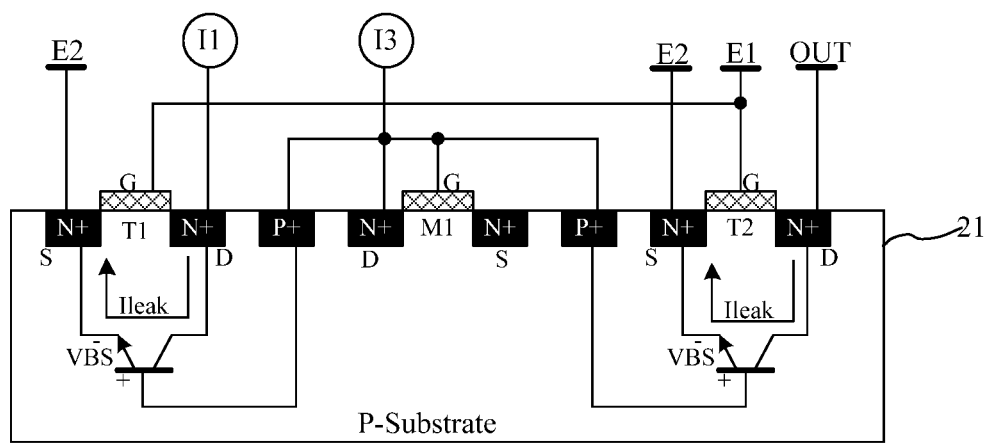
FIG. 6 schematically illustrates a semiconductor structure diagram of a switch circuit and a bias circuit of a voltage converter according to an embodiment of the present disclosure, illustrating a leakage current in the circuit.

FIG. 6 schematically illustrates a leakage current in the circuit of FIG. 5. As shown in FIG. 6, if the voltage difference VBS is greater than the threshold voltage $V_{TH\_H}$, then voltage difference VBS will turn on the first transistor T1, and the first transistor T1 will generate leakage current $I_{leak}$. Therefore, the voltage difference VBS must be smaller than $V_{TH\_H}$, that is, the semiconductor substrate 21 voltage VBS is smaller than the threshold voltage $V_{TH\_H}$ of the first transistor T1.

Figure 7:
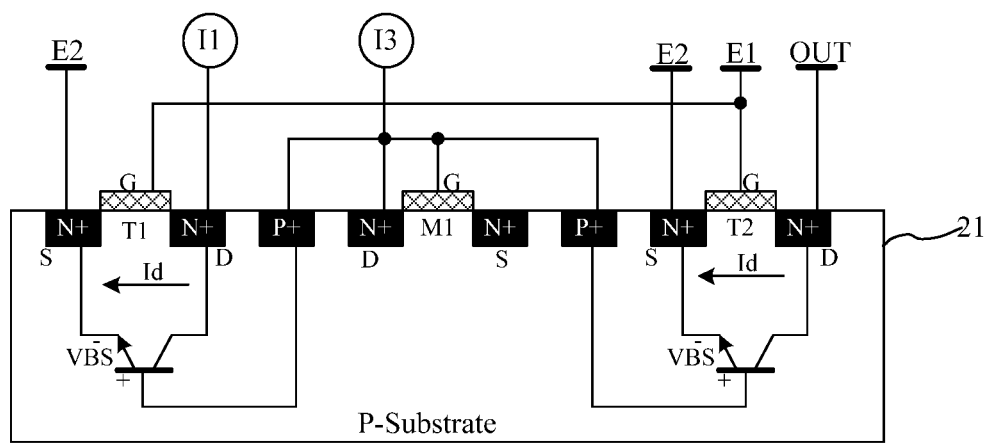

FIG. 7 illustrating a state when the switch circuit is turned on. As shown in FIG. 7, if the voltage difference VBS is smaller than the threshold voltage $V_{TH\_H}$, then the voltage difference VBS can raise the voltage of substrate 21, and thus decrease the threshold voltage of the first transistor T1, so that the threshold voltage $V_{TH\_H}$ is smaller than the first voltage signal VP1, then the current Id is generated between the source electrode S and the drain electrode D of the first transistor T1 when the first transistor T1 is turned on.

Optionally, the voltage of the semiconductor substrate 21 is equal to the turn-on voltage $V_{TH\_B}$ between the control end of the bias transistor M1 and the output end of the first transistor T1. As shown in FIG. 6, if the turn-on voltage $V_{TH\_B}$ is greater than the threshold voltage $V_{TH\_H}$, then the voltage difference VBS will make the path between the gate electrode G of the biased transistor M1 and the source S of the first transistor T1 conductive, and at the same time the first transistor T1 will be turned on, and the first transistor T1 will generate a leakage current $I_{leak}$. Therefore, the turn-on voltage $V_{TH\_B}$ must be smaller than the threshold voltage $V_{TH\_H}$, that is, the turn-on voltage $V_{TH\_B}$ between the control end of the bias transistor M1 and the output end of the first transistor T1 is smaller than the threshold voltage $V_{TH\_H}$ of the first transistor T1 to decrease the leakage current. In some embodiments, the voltage difference VBS is equal to the turn-on voltage $V_{TH\_B}$, then the conduction between the control end of the bias transistor M1 and the output end of the first transistor T1 will not turn on the first transistor T1, so as to avoid the leakage current of the first transistor T1.

The working principle of the second transistor T2 is the same with that of the first transistor T1, and will not be described in details here.

The magnitude of the voltage difference VBS is determined by the bias current signal $I_{BIAS}$. Therefore, when bias current signal $I_{BIAS}$ satisfies VBS=$V_{TH\_B}$+$\sqrt{I_{BIAS}/K}$., the first transistor T1 and the second transistor T2 will not be turned on. Thus, the leakage current can be avoided while the voltage of the semiconductor substrate 21 is increased.

Figure 8:
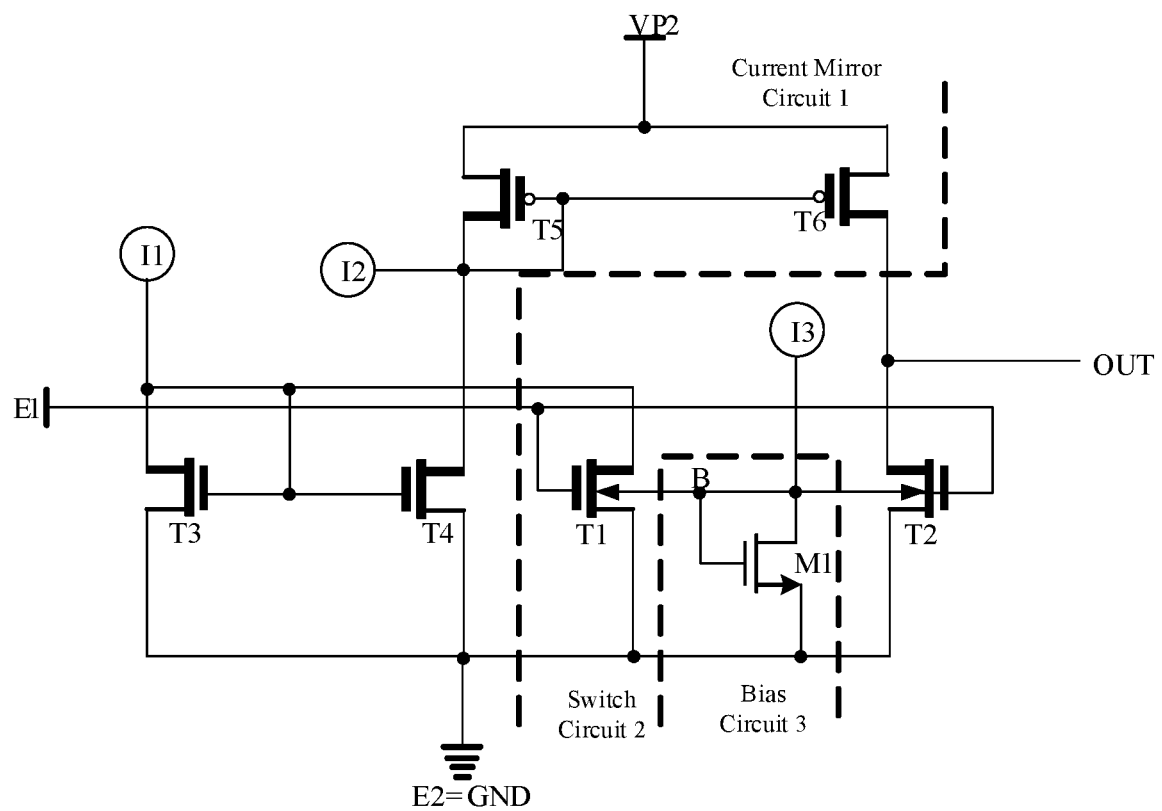
FIG. 8 illustrates a circuit of a voltage converter according to an embodiment of the present disclosure.
Figure 9:
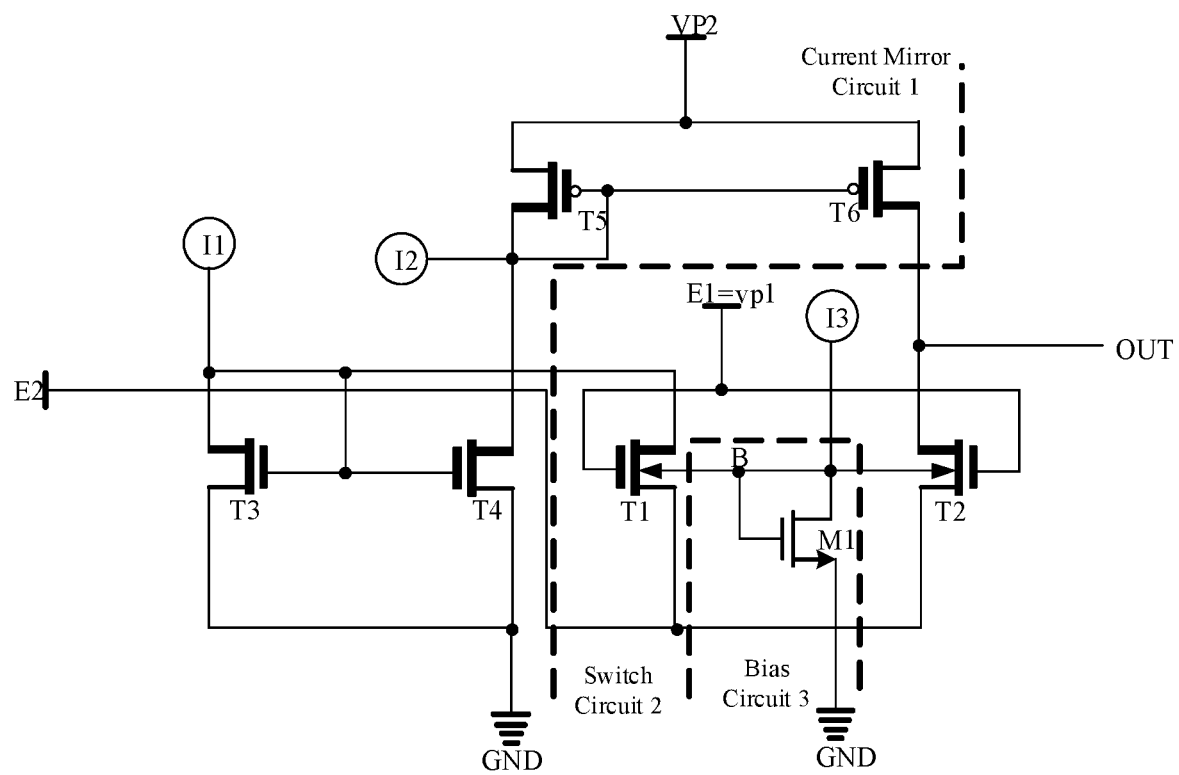
FIG. 9 illustrates a circuit of another voltage converter according to another embodiment of the present disclosure.

FIGS. 8-9 illustrate a current mirror circuit 1, the switch circuit 2 and the bias circuit 3 of a voltage converter according to an embodiment of the present disclosure. Referring to FIGS. 8-9, the current mirror circuit 1 includes a third transistor T3, a fourth transistor T4, a fifth transistor T5, and a sixth transistor T6 A control end and a first end of the third transistor T3 are both electrically connected to the first current end I1, and a second end of the third transistor T3 is electrically connected to the ground end GND. A control end of the fourth transistor T4 is electrically connected to the first current end I1, and the fourth transistor T4 is connected between a second current end I2 and the ground end GND, and the second current end I2 provides a second current signal. A control end and a first end of the fifth transistor T5 are both electrically connected to the second current end I2, and a second end of the fifth transistor T5 is electrically connected to the second power end VP2 A control end of the sixth transistor T6 is electrically connected to the second current end I2, and the sixth transistor T6 is electrically connected between the second power end VP2 and an output end OUT of the switch circuit 2. In some embodiment, the third transistor T3 and the fourth transistor T4 are both NMOS transistors and the same with each other, while both the fifth transistor T5 and the sixth transistor T6 are both PMOS transistors. In some embodiments, a width-to-length ratio of each of the fifth transistor T5 and the sixth transistor T6 is 1:k, wherein k is greater than 1.

In this embodiment, the transistors T3, T4, T5 and T6 constitute a current mirror, wherein the transistor T5 is connected in parallel with the transistor T6, and the width-to-length ratio of each of the fifth transistor T5 and the sixth transistor T6 is 1:k, wherein k is greater than 1. The bias transistor M1 is a bias device, which biases the substrate through a bias current signal. The voltage difference VBS is optionally greater than 0V and approximately equal to the turn-on voltage $V_{TH\_B}$. The transistor T1 and the transistor T2 are switching devices used to control the on and off states of the current mirror circuit 1; the threshold voltage of transistor T1 and the transistor T2 is $V_{TH\_H}$, and optionally the voltage difference VBS is smaller than the threshold voltage $V_{TH\_H}$.

Referring to FIG. 8, in an embodiment, the first electrical signal end E1 provides a first square signal, and the second electrical signal end E2 is grounded to the ground end GND. The high-level voltage signal of the first square wave signal is the first voltage signal vp1, and the low-level voltage signal is 0V. When no bias device is in the circuit, vp1<$V_{TH\_H}$<vp2. After adding the bias transistor M1 to the circuit, the bias current signal flows through the substrate to raise its voltage, then the threshold voltage $V_{TH\_H}$ of the first transistor T1 and the second transistor T2 is decreased to smaller than the first voltage signal vp1.

When voltage of first electrical signal end E1 equals to the first voltage signal vp1, the voltage of gate electrodes of the first transistor T1 and the second transistor T2 is equal to the first voltage signal vp1, and the bias transistor M1 makes the threshold voltage $V_{TH\_H}$ of the first transistor T1 and the second transistor T2 is smaller than vp1, then both the first transistor T1 and the second transistor T2 are turned on; the turn-on current of the first transistor T1 is the first current signal provided by the first current end I1, so that the transistors T3, T4, T5 and T6 are all turned off; the second transistor T2 is turned on, so that the output end OUT of the current mirror circuit 1 is pulled down to the ground end GND.

When the first electrical signal end E1 equals to 0V, the voltage of gate electrodes of the first transistor T1 and the transistor T2 is 0V, then the first transistor T1 and the second transistor T2 are both turned off, and the transistors T3, T4, T5 and T6 are all turned on; the turn-on current of the third transistor T3 is the first current signal provided by the first current end I1, the turn-on current of the fourth transistor T4 is the first current signal provided by the first current end I1 plus the second current signal provided by the second current end I2, and the turn-on current of the fifth transistor T5 is the first current signal provided by the first current end I1 as well, the sixth transistor T6 is turned on, so that the output end OUT of the current mirror circuit 1 outputs the second voltage signal vp2.

When the first voltage signal vp1 equals to 0V, the gate voltage of each of the first transistor T1 and the second transistor T2 is 0V, then the first transistor T1 and the second transistor T2 are both turned off, and the transistors T3, T4, T5 and T6 are turned on; the turn-on current of the third transistor T3 is the first current signal provided by the first current end I1, the turn-on current of the fourth transistor T4 is the first current signal provided by the first current end I1 plus the second current signal provided by the second current end I2, and the turn-on current of the fifth transistor T5 is also the first current signal provided by the first current end I1, so when the sixth transistor T6 is turned on, the output end OUT of the current mirror circuit 1 outputs the second voltage signal vp2.

Referring to FIG. 9, in an embodiment, the first electrical signal end E1 provides the first voltage signal vp1, and the second electrical signal end E2 provides the first square signal, wherein the high-level voltage signal of the first square signal is vp1, and the low-level voltage signal is 0V. When no bias transistor is in the circuit, vp1<$V_{TH\_H}$<vp2. After adding the bias transistor M1 to the circuit, the bias current signal flows through the substrate to raise its voltage, and the threshold voltage $V_{TH\_H}$ of the first transistor T1 and the second transistor T2 is decreased to less than the first voltage signal vp1.

When the voltage of second electrical signal end E2 equals to 0V, the gate voltage of each of the first transistor T1 and the second transistor T2 is equal to vp1, and the bias transistor M1 makes the threshold voltage $V_{TH\_H}$ of the first transistor T1 and the second transistor T2 smaller than the first voltage signal vp1, then both the first transistor T1 and the second transistor T2 are turned on; the turn-on current of the first transistor T1 is the first current signal provided by the first current end I1, so that the transistors T3, T4, T5 and T6 are all turned off; and the second transistor T2 is turned on, so that voltage of the output end OUT of the current mirror circuit 1 is pulled down to 0V.

When the voltage of second electrical signal end E2 equals to the first voltage signal vp1, the gate voltage of each of the first transistor T1 and the second transistor T2 is equal to the first voltage signal vp1, then the first transistor T1 and the second transistor T2 are both turned off, and the transistors T3, T4, T5 and T6 are turned on; the turn-on current of the third transistor T3 is the first current signal provided by the first current end I1, the turn-on current of the fourth transistor T4 is the first current signal provided by the first current end I1 plus the second current signal provided by the second current end I2, and the turn-on current of the fifth transistor T5 is the first current signal provided by the first current end I1, and the sixth transistor T6 is turned on, so that the output end OUT of the current mirror circuit 1 outputs the second voltage signal vp2.

When the first voltage signal vp1 provided by the first electrical signal end E1 equals to 0V, the gate voltage of each of the first transistor T1 and the second transistor T2 are both 0V, then the first transistor T1 and the second transistor T2 are both turned off, and the transistors T3, T4, T5 and T6 are turned on; the turn-on current of the third transistor T3 is the first current signal provided by the first current end I1, the turn-on current of the fourth transistor T4 is the first current signal provided by the first current end I1 plus second current signal provided by the second current end I2, and the turn-on current of the fifth transistor T5 is the first current signal provided by the first current end I1, and the sixth transistor T6 is turned on, so that the output end OUT of the current mirror circuit is output as second voltage signal vp2.

As mentioned above, no matter whether the voltage vp1 provided by the first electrical signal end E1 is greater than 0V or equal to 0V, the on and off states of the switch circuit are always clearly known, and the output end of the current source circuit can output a valid signal, therefore, the situation where the output end of the current source circuit is unknown due to unknown on and off states of the switch circuit can be avoided.

Figure 10:
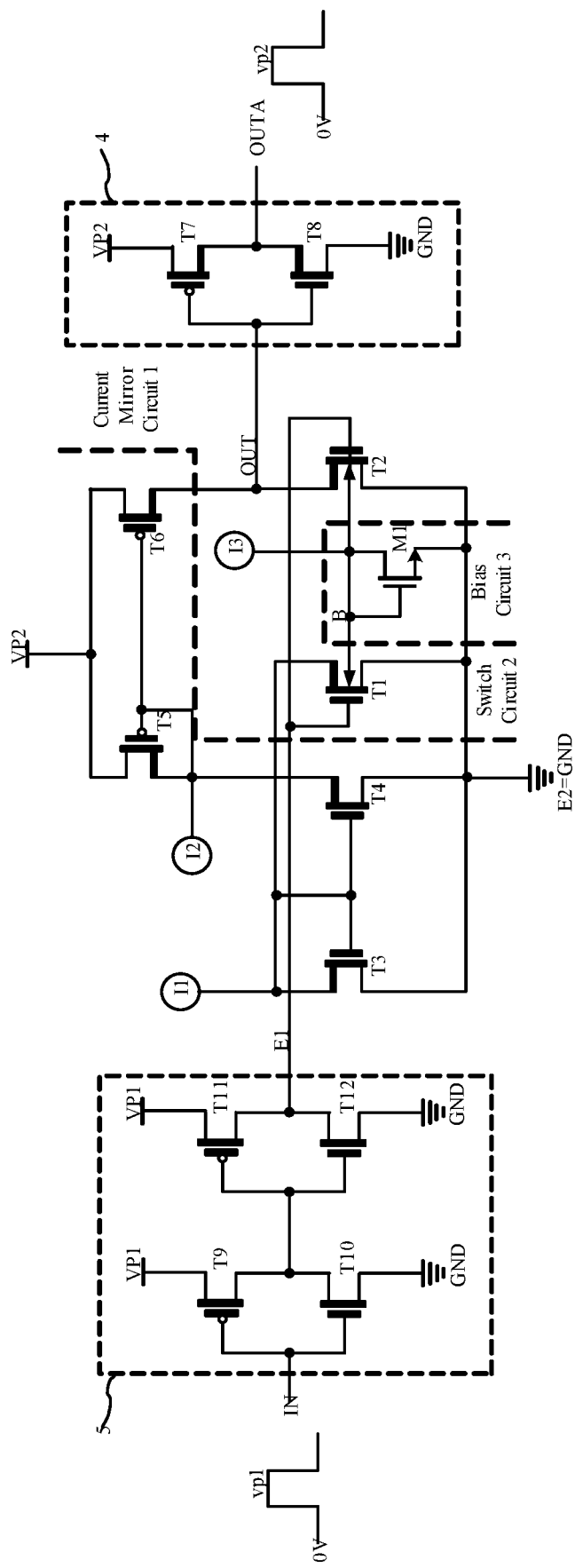
FIG. 10 illustrates a voltage converter according to another embodiment of the present disclosure.
Figure 11:
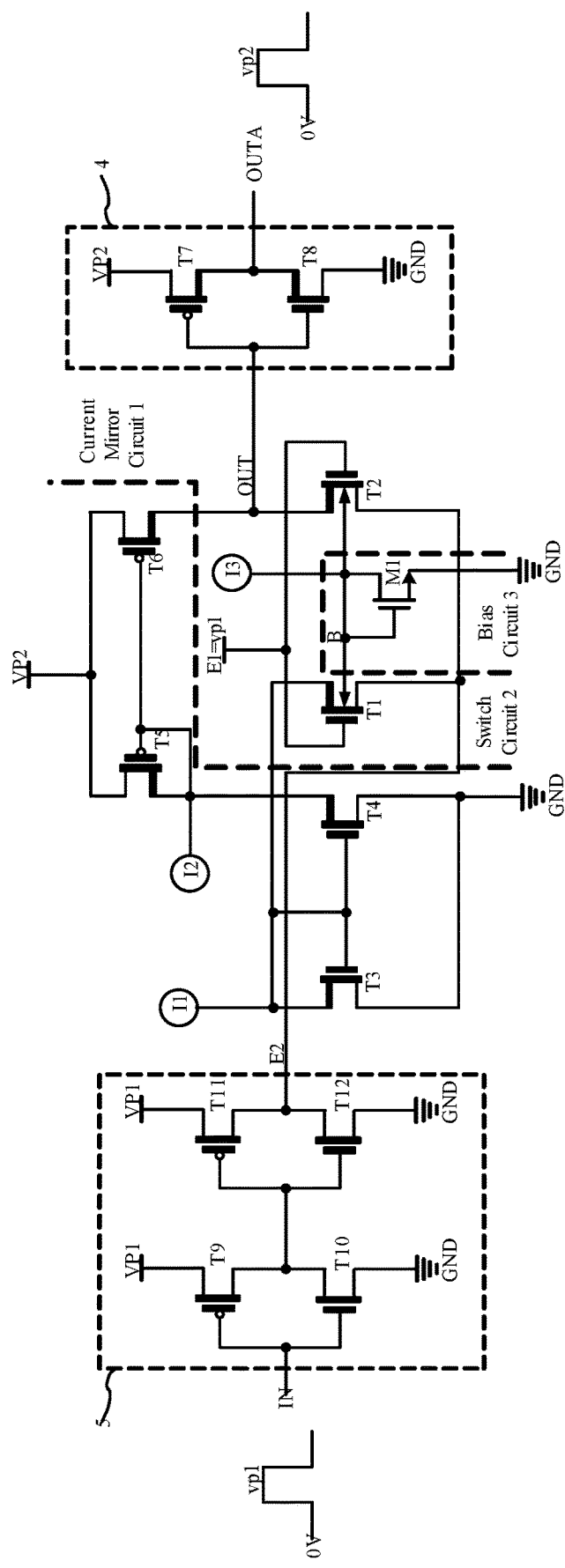
FIG. 11 illustrates a voltage converter according to another embodiment of the pre sent disclosure.

FIGS. 10-11 illustrate a voltage converter according to another embodiment of the present disclosure. As shown in FIGS. 10 and 11, in the illustrated embodiment, the voltage converter further includes an invert circuit 4, wherein an input end of the invert circuit 4 is electrically connected to the output end OUT of the current mirror circuit 1. The reverse circuit 4 includes a seventh transistor T7 and an eighth transistor T8. A control end of the seventh transistor T7 and a control end of the eighth transistor T8 are both electrically connected to the output end OUT of the current mirror circuit 1; and the seventh transistor T7 is connected between the second power end VP2 and an output end OUTA of the reverse circuit 4. The eighth transistor T8 is connected between the ground end GND and the output end of the reverse circuit 4. In some embodiments, the seventh transistor T7 is a PMOS transistor, and the eighth transistor T8 is a NMOS transistor.

Optionally, the threshold voltage of each transistor in the switch circuit, the reverse circuit, and the current mirror circuit is smaller than the second voltage signal vp2 and greater than the high-level voltage signal vp1 provided by the first electrical signal end E1. It can be understood that when no bias transistor is in the circuit, the threshold voltage of each transistor in the switch circuit 2 is smaller than the second voltage signal vp2, and is greater than the high-level voltage signal vp1 provided by the first electrical signal end E1. Adding the bias transistor M1 to the circuit can help to raise the electric potential of the semiconductor substrate in the switch circuit 2 to decrease the threshold voltage of each transistor in the switch circuit 2 down to smaller than the high-level signal vp1 provided by the first electrical signal end E1.

Optionally, the voltage converter further includes an isolation circuit 5. An input end of the isolation circuit 5 receives the first wave signal IN, and an output end of the isolation circuit 5 serves as the first electrical signal end E1 as illustrated in FIG. 10 or the second electrical signal end E2 as illustrated in FIG. 11. In some embodiments, the isolate circuit 5 includes a first inverter to receive an input signal and a second inverter electrically connected in series, wherein an output end of the second inverter serves as the first electrical signal end E1 or the second electrical signal end E2. The inverter includes two transistors with two different polarities, wherein a threshold voltage of each transistor is smaller than the high-level voltage vp1 provided by the first electrical signal end E1.

As shown in FIG. 10, the output end of isolation circuit 5 serves as the first electrical signal end E1. As shown in FIG. 11, the output end of isolation circuit 5 serves as the second electrical signal end E2.

In the embodiment illustrated in FIGS. 10-11, optionally, the tenth transistor T10 and twelfth transistor T12 are both NMOS transistors and their threshold voltage is $V_{TH\_L}$. The ninth transistor T9 and the eleventh transistor T11 are both PMOS transistors, and their threshold voltage is close to $-V_{TH\_L}$.

The first transistor T1, the second transistor T2, the third transistor T3, the fourth transistor T4 and the eighth transistor T8 are all high-voltage NMOS transistors, whose threshold voltage is $V_{TH\_H}$.

The fifth transistors T5, the sixth transistors T6 and the seventh transistors T7 are all high-voltage PMOS transistors, and their threshold voltage is close to $-V_{TH\_H}$.

The voltages are: $vp2 > V_{TH\_H} > vp1 > V_{TH\_L}$. The bias transistor M1 is a NMOS transistor and its threshold voltage $V_{TH\_B}$ is smaller than the threshold voltage $V_{TH\_H}$ of the first transistor T1.

As shown in FIG. 10, when voltage of the first square signal IN=vp1, the gate voltage of each of the first transistor T1 and the second transistor T2 is the first voltage signal vp1, and the bias transistor M1 makes the threshold voltage VTH_H of the first transistor T1 and the second transistor T2 smaller than the first voltage signal vp1, then the first transistor T1 and the second transistor T2 are both turned on; the turn-on current of the first transistor T1 is the first current signal provided by the first current end I1, the transistors T3, T4, T5 and T6 are all turned off; and the second transistor T2 is turned on, so that the output end OUT of the current mirror circuit is pulled down to the ground end GND, and the output end OUTA of the reverse circuit 4 outputs the second voltage signal vp2 after reverse.

When voltage of the first square signal IN equals to 0V, the gate voltage of each of the first transistor T1 and the second transistor T2 is 0V, then the first transistor T1 and the second transistor T2 are both turned off, and the transistors T3, T4, T5 and T6 are turned on; the turn-on current of the third transistor T3 is the first current signal provided by the first current end I1, the turn-on current of the fourth transistor T4 is the first current signal provided by the first current end I1 plus second current signal provided by the second current end I2, and the turn-on current of the fifth transistor T5 is the first current signal provided by the first current end I1 as well, and the sixth transistor T6 is turned on, so that the output end OUT of the current mirror circuit outputs the second voltage signal vp2, and the output end OUTA of the reverse circuit 4 inputs 0 after reverse.

When the voltage provided by the first electrical signal end E1 equals to 0V, the gate voltage each of the first transistor T1 and the second transistor T2 is 0V, then the first transistor T1 and the second transistor T2 are both turned off, and the transistors T3, T4, T5 and T6 are turned on; the turn-on current of the third transistor T3 is the first current signal provided by the first current end I1, the turn-on current of the fourth transistor T4 is the first current signal provided by the first current end I1 plus the second current signal provided by the second current end I2, and the turn-on current of the fifth transistor T5 is the first current signal provided by the first current end I1. The sixth transistor T6 is turned on, so that the output end OUT of the current mirror circuit outputs the second voltage signal vp2, and the voltage of the output OUTA of the reverse circuit 4 is 0 after reverse.

As shown in FIG. 11, when voltage of the first square signal IN equals to 0V, the gate voltage of each of the first transistor T1 and second transistor T2 is the first voltage signal vp1, and the bias transistor M1 makes the threshold voltage $V_{TH\_H}$ of the first transistor T1 and the second transistor T2 smaller than the first voltage signal vp1, then both the first transistor T1 and the second transistor T2 are turned on; the turn-on current of the first transistor T1 is the first current signal provided by the first current end I1, so that the transistors T3, T4, T5 and T6 are all turned off; and the second transistor T2 is turned on, so that the output end OUT of the current mirror circuit 1 is pulled down to 0V, and the voltage of the output end OUTA of reverse circuit 4 outputs the second voltage signal vp2 after reverse.

When voltage of the first square signal IN equals to the first voltage signal vp1, the gate voltage each of the first transistor T1 and the second transistor T2 is equal to the first voltage signal vp1, then the first transistor T1 and the second transistor T2 are both turned off, and the transistors T3, T4, T5 and T6 are turned on; the turn-on current of the third transistor T3 is the first current signal provided by the first current end I1, the turn-on current of the fourth transistor T4 is the first current signal provided by the first current end I1 plus the second current signal provided by the second current end I2, and the turn-on current of the fifth transistor T5 is the first current signal provided by the first current end I1. The sixth transistor T6 is turned on, so that the output end OUT of the current mirror circuit 1 outputs the second voltage signal vp2, and voltage of the output end OUTA of the reverse circuit 4 outputs 0V after reverse.

When voltage vp1 provided by the first electrical signal end E1 equals to 0V, the gate voltage each of the first transistor T1 and the second transistor T2 is 0V, then the first transistor T1 and the second transistor T2 are both turned off, and the transistors T3, T4, T5 and T6 are turned on; the turn-on current of the third transistor T3 is the first current signal provided by the first current end I1, the turn-on current of the fourth transistor T4 is the first current signal provided by the first current end I1 plus the second current signal provided by the second current end I2, and the turn-on current of the fifth transistor T5 is I1. The sixth transistor T6 is turned on, so that the output end OUT of the current mirror circuit 1 outputs the second voltage signal vp2, and the output end OUTA of the reverse circuit 4 outputs 0V after reverse.

The voltage converters according to the embodiments of the present disclosure uses a bias current signal to bias the semiconductor substrate of the switch circuit, instead of biasing via a bias voltage signal. In this way, the accuracy of the voltage converter's signal transmission is improved, the interference of noise on the voltage converter is reduced, and high withstand voltage performance is achieved. Furthermore, it also decreases a generation of leakage current, which can prevent the load circuit from short-circuiting. It can be understood that the voltage converter can be used in a variety of devices, such as voltage regulators etc.

The above is a detailed description of the present disclosure in connection with the specific preferred embodiments, and the specific embodiments of the present disclosure are not limited to the description. Modifications and substitutions can be made without departing from the spirit and scope of the present disclosure.

What is claimed is:

1. A voltage converter comprising:
a current mirror circuit, wherein a first end of the current mirror circuit is electrically connected to a first current end, and a second end of the current mirror circuit is electrically connected to a second power end wherein the first current end provides a first current signal and the second power end provides a second voltage signal;
a switch circuit electrically connected between the first current end and a second electrical signal end, wherein a first end of the switch circuit is electrically connected to a first electrical signal end, and an output end of the switch circuit is electrically connected to an output end of the current mirror circuit; and
a bias circuit electrically connected to a substrate of the switch circuit, wherein the bias circuit is electrically connected between a bias current end and a ground end, and the bias current end is configured to provide a bias current signal to raise a substrate voltage of the switch circuit while the bias circuit is turned on;
wherein, when an electrical signal provided by the first electrical signal end is greater than an electrical signal provided by the second electrical signal end, the bias circuit is turned on to turn on the switch circuit, such that the first current signal is shunted by the switch circuit, the current mirror circuit is turned off, and an output end of the mirror current circuit outputs the electrical signal provided by the second electrical signal end;
when the electrical signal provided by the first electrical signal end is equal to the electrical signal provided by the second electrical signal end, the switch circuit is turned off, such that the first current signal is inputted into the current mirror circuit to turn on the current mirror circuit, and the output end of the current mirror circuit outputs the second voltage signal; and
wherein the second voltage signal is greater than a high-level voltage signal provided by the first electrical signal end.

2. The voltage converter according to claim 1, wherein, when the first electrical signal end provides a first square signal, and the second electrical signal end is electrically connected to the ground end, an electric potential of a high-level voltage signal in the first square signal is higher than or equal to an electric potential of the ground end, and lower than an electric potential of the second voltage signal.

3. The voltage converter according to claim 2, wherein the voltage converter further comprises an isolate circuit, and wherein an input end of the isolate circuit is configured to receive the first square signal, and an output end of the isolate circuit serves as the first electrical signal end.

4. The voltage converter according to claim 3, wherein the isolate circuit comprises a first inverter to receive an input signal and a second inverter electrically connected in series, wherein the output end of the second inverter serves as the first electrical signal end;
wherein each of the first inverter and the second inverter comprises two transistors with two different polarities.

5. The voltage converter according to claim 4, wherein a threshold voltage of each transistor is smaller than the high-level voltage provided by the first electrical signal end.

6. The voltage converter according to claim 1, wherein, when the first electrical signal end provides a first voltage signal, and the second electrical end provides a first square signal,
an electric potential of a high-level voltage signal in the first square signal is equal to an electric potential of the first voltage signal, and lower than an electric potential of the second voltage signal.

7. The voltage converter according to claim 6, wherein the voltage converter further comprises an isolate circuit, wherein an input end of the isolate circuit is configured to receive the first square signal, and an output end of the isolate circuit serves as the second electrical signal end.

8. The voltage converter according to claim 7, wherein the isolate circuit comprises a first inverter to receive an input signal and a second inverter electrically connected in series, wherein the output end of the second inverter serves as the second electrical signal end; and
wherein each of the first inverter and the second inverter comprises two transistors with two different polarities.

9. The voltage converter according to claim 8, wherein a threshold voltage of each transistor is smaller than the high-level voltage provided by the first electrical signal end.

10. The voltage converter according to claim 1, wherein the switch circuit comprises a first transistor and a second transistor;
wherein a control end of the first transistor and a control end of the second transistor are both electrically connected to the first electrical signal end, the first transistor is electrically connected between the first current end and the second electrical signal end, and the second transistor is connected between the second electrical signal end and the output end of the current mirror circuit.

11. The voltage converter according to claim 10, wherein a threshold voltage of each transistor of the switch circuit is smaller than the second voltage signal, and greater than the high-level voltage signal provided by the first electrical signal end.

12. The voltage converter according to claim 10, wherein the bias circuit comprises a bias transistor, and the bias transistor shares a semiconductor substrate with the first transistor and the second transistor; and
wherein a control end of the bias transistor is electrically connected to the semiconductor substrate and the bias current end, an input end of the bias transistor is electrically connected to the bias current end, and an output end of the bias transistor is electrically connected to the ground end.

13. The voltage converter according to claim 12, wherein the bias transistor, the first transistor and the second transistor are all NMOS transistors; and
wherein a voltage of the semiconductor substrate is greater than 0V, and smaller than a threshold voltage of the first transistor.

14. The voltage converter according to claim 13, wherein a voltage of the semiconductor substrate is equal to a turn-on voltage between the control end of the bias transistor and an output end of the first transistor.

15. The voltage converter according to claim 1, wherein, the current mirror circuit comprises a third transistor, a fourth transistor, a fifth transistor, and a sixth transistor;
wherein a control end and a first end of the third transistor are both electrically connected to the first current end, and a second end of the third transistor is electrically connected to the ground end;

wherein a control end of the fourth transistor is electrically connected to the first current end, and the fourth transistor is connected between a second current end and the ground end, wherein the second current ends provides a second current signal;

wherein a control end and a first end of the fifth transistor are both electrically connected to the second current end, and a second end of the fifth transistor is electrically connected to the second power end;

wherein a control end of the sixth transistor is electrically connected to the second current end, and the sixth transistor is electrically connected between the second power end and the output end of the switch circuit; and wherein the third transistor and the fourth transistor are both NMOS transistors and the same with each other, and the fifth transistor and the sixth transistor are both PMOS transistors.

16. The voltage converter according to claim 15, wherein a width-to-length ratio of each of the fifth transistor and the sixth transistor is 1:k, wherein k is greater than 1.

17. The voltage converter according to claim 15, wherein a threshold voltage of each transistor of the current mirror circuit is smaller than the second voltage signal, and greater than the high-level voltage signal provided by the first electrical signal end.

18. The voltage converter according to claim 1, wherein the voltage converter further comprises a reverse circuit, and an input end of the reverse circuit is electrically connected to the output end of the current mirror circuit.

19. The voltage converter according to claim 18, wherein the reverse circuit comprises a seventh transistor and an eighth transistor;

wherein a control end of the seventh transistor and a control end of the eighth transistor are both electrically connected to the output end of the current mirror circuit;

wherein the seventh transistor is connected between the second power end and an output end of the reverse circuit, and the eighth transistor is connected between the ground end and the output end of the reverse circuit; and wherein the seventh transistor is a PMOS transistor, and the eighth transistor is a NMOS transistor.

20. The voltage converter according to claim 19, wherein a threshold voltage of each transistor of the reverse circuit is smaller than the second voltage signal, and greater than the high-level voltage signal provided by the first electrical signal end.

* * * * *